United States Patent [19]
Olesen et al.

[11] Patent Number: 6,122,837
[45] Date of Patent: Sep. 26, 2000

[54] CENTRIFUGAL WAFER PROCESSOR AND METHOD

[75] Inventors: Michael B. Olesen, Yorba Linda; Mario E. Bran, Garden Grove, both of Calif.

[73] Assignee: Verteq, Inc., Santa Ana, Calif.

[21] Appl. No.: 09/103,930

[22] Filed: Jun. 24, 1998

Related U.S. Application Data
[60] Provisional application No. 60/050,767, Jun. 25, 1997.

[51] Int. Cl.[7] ........................................ F26B 5/08
[52] U.S. Cl. ................ 34/315; 34/317; 34/321; 34/59
[58] Field of Search ................ 34/317, 58, 59, 34/318, 323, 326, 315

[56] References Cited

U.S. PATENT DOCUMENTS

| | | |
|---|---|---|
| 4,300,581 | 11/1981 | Thompson . |
| 4,571,850 | 2/1986 | Hunt et al. . |
| 4,841,645 | 6/1989 | Bettcher et al. . |
| 5,050,126 | 9/1991 | Tanaka et al. . |
| 5,054,210 | 10/1991 | Schumacher et al. . |
| 5,143,103 | 9/1992 | Basso et al. . |
| 5,271,774 | 12/1993 | Leenaars et al. . |
| 5,443,540 | 8/1995 | Kamikawa ................................ 34/471 |
| 5,884,640 | 3/1999 | Fishkin et al. ............................... 34/77 |
| 5,954,911 | 9/1999 | Bergman ..................................... 34/72 |

*Primary Examiner*—Denise L. Ferensic
*Assistant Examiner*—Michelle A Mattera
*Attorney, Agent, or Firm*—Knobbe, Martens, Olson & Bear, LLP

[57] ABSTRACT

A dryer for processing semiconductor substrates which rotates a carrier containing the substrates within a housing in combination with a bubbler which heats and directs a gas containing a water tension reducing vapor to the housing to contact the substrates and thereby hasten drying, decrease water marking, and decrease contamination.

12 Claims, 5 Drawing Sheets

CENTRIFUGAL WAFER PROCESSOR AND METHOD

CROSS-REFERENCE TO RELATED APPLICATION

Pursuant to 35 U.S.C. § 119(e), this application claims the priority benefit of provisional application Ser. No. 60/050,767, filed Jun. 25, 1997.

FIELD OF THE INVENTION

The present invention relates to an apparatus and method for processing semiconductor wafers or glass photomask plates, i.e., substrates, and in particular, to an improved rinser/dryer apparatus which rotates a carrier containing the substrates within a housing.

BACKGROUND OF THE INVENTION

The production of integrated circuits requires the use of semiconductor wafers, also known as substrates. Processing semiconductor wafers requires multiple steps. At each step, layers of material are deposited and processed on the wafer surface. The wafers are typically circular, generally 0.031 inch thick and in the range of 100–300 mm in diameter. Accordingly, the wafers are very fragile.

The deposition the materials upon these fragile substrates requires that the wafers be coated with numerous solutions and then rinsed. It is important that the wafer remain extremely clean and be completely dry before the next processing step begins. To remove the chemicals from the previous step, the wafers undergo a rinse and dry cycle between processing steps. Generally, deionized water rinses impurities or contaminates from the wafer, after which a separate process dries the wafer.

Various processing devices perform the task of rinsing and drying. U.S. Pat. Nos. 4,300,581, to Thompson and 4,571,850 to Hunt, et al. describe one such device in which a wafer carrier connects to a frame that rotates while stationary nozzles spray fluid to rinse the wafers, or alternately, inject heated gas to dry the wafers. A carrier is a device which holds a number of wafers during the processing steps and during transportation from one step to another. The rotation causes water or moisture to be centrifugally thrown from the wafer and carrier.

Although centrifugal-type dryers provide distinct advantages over the prior art, certain disadvantages still exist. For example, one disadvantage of centrifugal drying is that water marks may form on the wafer. Water marks result when some of the water dries on the wafer instead of being thrown off during rotation. The residual water, along with the spinning of the wafer, may leave streaks which run from the center of the wafer to the outside edge, i.e., water marks. Water marks damage the surface of the silicon wafer and are therefore undesirable. Therefore, a need still exists for a drying method and apparatus which minimize such marks.

In response to this need for a drying method which does not leave water marks, a system was developed which slowly lifts the wafers out of a deionized water bath while exposing the wafer surface above the water line to a solvent vapor. The resulting wafer is entirely void of water because, the vapor, which plays an essential role in this drying process, interacts chemically with the water to decrease the water's surface tension and adhesive strength. More simply, the vapor absorbs into the top edge of the water bath and inhibits the formation of water droplets which would otherwise form on the wafer. However, for this method to successfully inhibit the formation of water droplets, the wafer must exit the water very slowly. Thus, for a normal size wafer, the time to complete the drying process commonly exceeds ten minutes.

U.S. Pat. No. 5,143,103 issued to Basso, et al., U.S. Pat. No. 5,054,210 issued to Schumacher, et al., and U.S. Pat. No. 4,841,645 issued to Bettcher, et al. adopt this method of drying. The preferred solvent is isopropyl alcohol (IPA), however, other vapor from other solvents achieve a similar result, i.e., reducing the surface tension of water. Drying systems utilizing this method have the advantage of drying silicon wafers with low contaminant particle counts while leaving the wafer surface free of water marks.

However, a common disadvantage to these substrate drying methods is the length of time required to perform a dry cycle. For example, a normal spin dry cycle takes 5–6 minutes. The average cycle length for the method which lifts the wafers out of water and into IPA vapor generally exceeds 10 minutes. Dry cycles of this length slow substrate production.

An alternative method for drying wafers combines spinning and IPA liquid. Japanese Patent 402237029 discloses spinning a wafer while dripping or pouring liquid IPA onto the center of the wafer. The liquid IPA, in conjunction with the water or moisture, is thrown from the wafer from the rotation. This method, although preventing water marks, has serious drawbacks. First, the liquid IPA is reactive, i.e., it can corrosively damage the fragile surface of the wafer. Second, this method uses relatively large amounts of IPA, which is undesirable because of government regulations regarding the amount of solvent which may be released into the environments. Thus, this method may require additional apparatus to limit IPA release into the environment. Third, it is difficult to dry multiple wafers simultaneously using this method because it is difficult to drip or pour IPA liquid onto multiple spinning wafers. IPA is also flammable; and using this method, which has high IPA concentrations, may increase the risk of fire or explosion.

The background section of U.S. Pat. No. 5,050,126 to Moe makes reference to the use of IPA with a centrifugal dryer, but no details of such an arrangement are given. It is also understood that IPA liquid has been sprayed into a centrifugal dryer. However, this is not vapor and a relatively large amount of IPA would have to be used. Furthermore, spraying IPA into the dryer does not provide a uniform application, which leads to ineffective drying.

U.S. Pat. No. 5,271,774 discloses a single wafer horizontally positioned on a centrifuge and a bubbler for conducting a carrier gas through an IPA reservoir and into a chamber surrounding the centrifuge to facilitate removal of a film of liquid on the wafer. The liquid combined with the bubbler gas is directed out of the chamber.

Notwithstanding these prior efforts, a need exists for a silicon wafer dryer which (1) drys a cassette load of wafers quickly, (2) minimizes the presence of water marks, (3) reduces particulate contamination, (4) uses relatively low amounts of alcohol or solvent, and (5) decreases the risk of fire or explosion.

SUMMARY OF THE INVENTION

The present invention provides an apparatus and method for cleaning and drying silicon wafers or other such substrates. Advantageously, the present invention combines solvent vapor such as IPA with a spin dryer to decrease drying time, decrease contaminant particle counts per wafer, and decrease the creation of water marks on the wafers.

The spin unit of the present invention accepts a carrier full of wafers and spins the carrier at high speed to throw the water off the wafers by centrifugal force. IPA vapor is preferably introduced to the spin unit from a bubbler in which heated inert gas, such as nitrogen, is bubbled through liquid. The IPA vapor decreases the water's adhesion to the wafer, which in combination with the centrifugal force created by rotation within the spin unit, removes the water from the wafer.

The spin unit typically comprises an outer shell and an outer door. A motor mounted to the shell including a shaft connects to a frame for supporting a wafer carrier. Within a housing enclosing the frame, a plurality of nozzles are provided for injecting heated gas as well as a gas carrier containing IPA vapor into the spin unit.

The spin unit has a drain or exhaust vent so that water, contaminants, gas and IPA vapor may exit the housing. An electronic controller, which interfaces with the bubbler, oversees operation of the spin unit. Gas line connectors link with clean room gas lines and the bubbler unit.

Nitrogen gas, which is generally plumbed directly into modem clean rooms, is fed into the bubbler through a conduit or pipe. A three-way valve which directs the gas to either the spin unit or an IPA liquid reservoir. A reservoir flow tube conducts the gas to the bottom of the reservoir so that the gas bubbles upwardly through the IPA liquid and absorbs IPA as vapor. A heater preferably heats the gas to increase absorption of the IPA into the gas.

Preferably, an insulator tube is provided which is spaced from and surrounds the reservoir flow tube. The internal volume of the insulator tube is in fluid communication with the rest of the liquid in the reservoir. The insulator tube limits the gas bubbles' upward gravitation to the inner volume of the insulator tube. The confinement elevates the temperature of the liquid inside the insulator tube to maximize absorption of the IPA.

The bubbler links electronically to the spin unit to coordinate gas and IPA vapor flow during the appropriate time of the spin unit cycle.

Alternatively, the spin unit and the bubbler may combine into a single unit. However, it is advantageous to have a separate bubbler unit so that it may be conveniently added to an existing spin unit as a retrofit device.

Advantageously, the present invention decreases contaminant particle counts, reduces drying time and minimizes water marks. Surprisingly, these improved results can be obtained with a small quantity of IPA vapor relative to the large volume of nitrogen injected into the dryer. This eliminates concern for explosive risks associated with the use of some conventional IPA dryers and greatly decreases any environmental problems concerning the disposal of IPA.

Further objects, features, and advantages of the present invention over the prior art will become apparent from the detailed description when considered with the attached figures.

DETAILED DESCRIPTION OF THE PREFERRED EMBODIMENT

Figure 1:
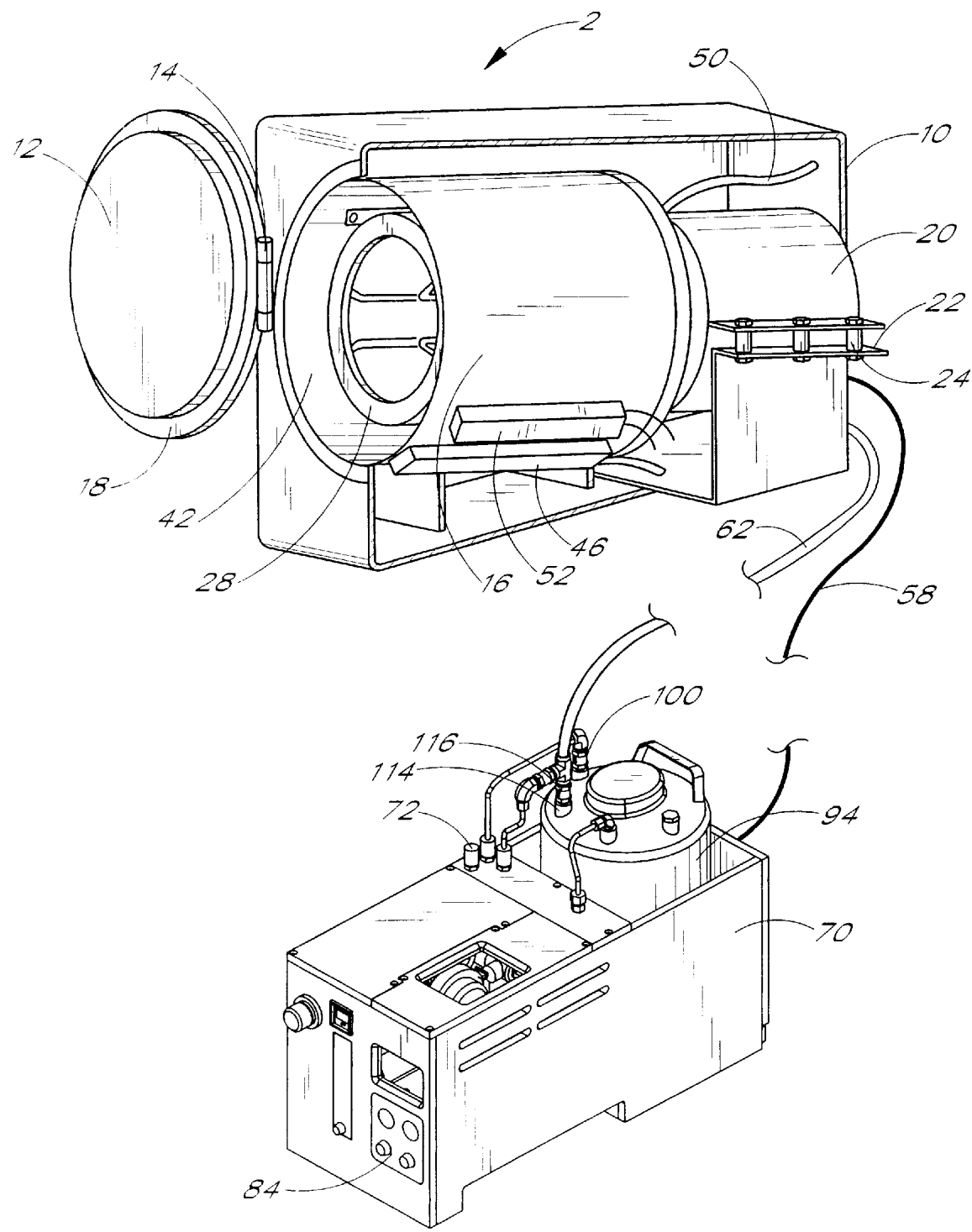
FIG. 1 is a perspective view of the bubbler and the spin unit.
Figure 2:
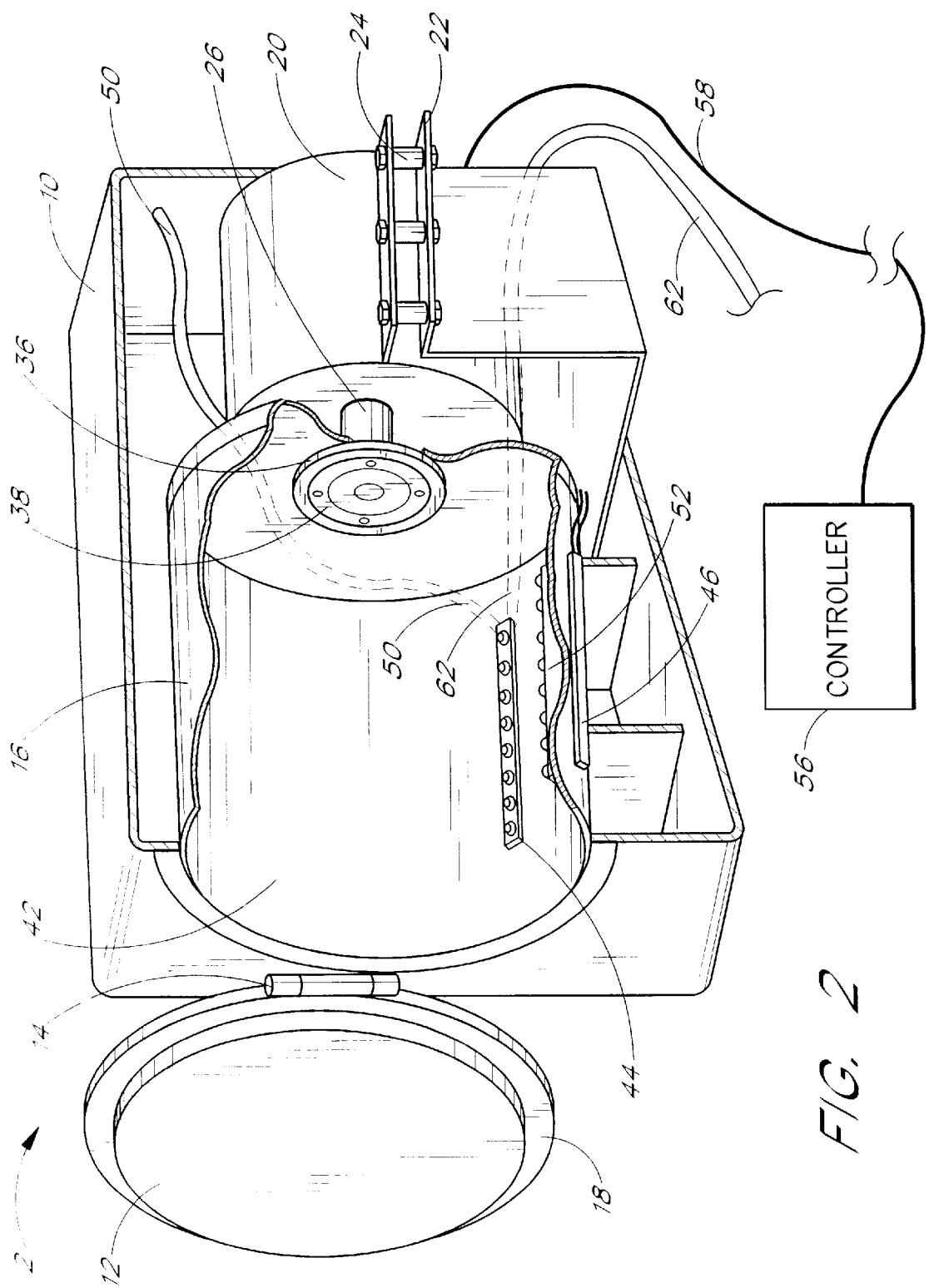
FIG. 2 is a cross-sectional perspective view of the spin unit.

As seen in FIGS. 1 and 2, a bubbler 4 is shown linked to spin unit 2, which includes an outer shell 10 enclosing the internal components of the spin unit together with a front door 12, which pivots about a hinge 14 having an approximately vertical axis. The door 14 in conjunction with a seal 18 provides a gas-tight seal to prevent particulate contamination from entering the housing 16. Top loading spin units are also known. A motor 20 mounts rearward in the spin unit 2 on frame 22 incorporating vibration insulation mounts 24. A motor driven shaft 26 extends forward from the motor 20 into the housing 16 and supports an end plate 38 which supports a substrate carrier frame 28.

A seal 36 exists between the motor shaft 26 and the housing 16 to prevent contaminants from entering the housing. As is well known by those skilled in the art, many different types of seals exist, including magnetic liquid, rubber, silicon, or nylon. Preferably, positive gas pressure inside the housing 16 creates a non-load bearing air seal between the shaft 26 and the housing 16.

Positive pressure inside the housing 16 causes contaminant free gas to continually flow from within the housing volume out through the air seal 36. The continual flow of gas out of the housing 16 prevents airborne contaminants from entering the housing. Likewise, since the seal 36 utilizes gas flow, there is not a conventional rubber or grease bearing seal to breakdown thereby introducing contaminants into the housing 16. U.S. Pat. No. 4,571,850 Hunt, et al. illustrates a non-load bearing positive pressure seal.

The rotatable frame 28 removably and slidably receives a wafer carrier. Accordingly, the shape of the rotatable frame 28 will vary depending upon the shape of the carrier. The carrier (not shown) is a device which holds wafers, substrates, or photomask plates during processing and transportation therebetween. The wafer carrier is typically made of a polymer material, such as polypropylene or a Teflon such as FEP or TFE Teflon. The rotatable frame 28, the wafer carrier, and wafers rotate as one unit. Carriers are common in the wafer processing art and are described in more detail in U.S. Pat. No. 4,571,850 to Hunt, et al.

The housing 16 has an inner surface 42 with a plurality of gas inlets or nozzles 44. The gas inlets are permanently located to either side of or below the wafer carrier to prevent any condensed vapor in the form of fluid from entering the housing 16 and thereby dripping down onto the substrates. The air inlets 44 communicate gas or a gas and IPA vapor mixture into the housing 16 at appropriate times during a spin dry cycle. Additional sets of nozzles 44 may be strategically located to further inject gas or IPA vapor into the housing 16 to improve IPA vapor dispersement therein. The influx of gas through the nozzles 44 creates positive pressure within the housing 16 that prevents contaminants from entering the housing 16.

Inside the spin unit 2 is a main gas line 50 which connects the nozzles 44 with a clean room gas line (not shown). Flow through the main gas line 50 is independent of the bubbler 4 and is heated to generally 100 degrees C to further hasten drying. A regulator (not shown) maintains the pressure at a desired pressure, at about 42 pounds per square inch (psi). The gas in the main flow line 50 combines with gas from the bubbler 4 at the air nozzle 44, before entering the housing 16.

At the lower right of the housing 16 are rinse nozzles or water inlets 52 which spray fluid, most commonly deionized water, into the housing to rinse the substrates or the housing between drying cycles. The rinse nozzles 52 are permanently located to either side or below the wafer carrier to prevent any residual water from dripping onto the wafers. Additional sets of rinse nozzles 52 may be strategically located in the housing 16 to further rinse and clean the housing and/or the wafers therein.

An exhaust or drain 46 is also on the inner surface of the housing 16. The exhaust 46 provides egress from the housing 16 for excess nitrogen gas, IPA vapor, water and contaminants. The exhaust 46 connects to a main exhaust line (not shown).

An electronic controller 56 controls the cycles of the spin unit 2. The controller's electronics are of diverse nature and are commonly available in the industry, and accordingly are not shown. Alternatively, electrical cables connect the spin unit 2 to the bubbler 4, thereby allowing a common controller to oversee, direct and synchronize operation of the two machines.

Figure 3:
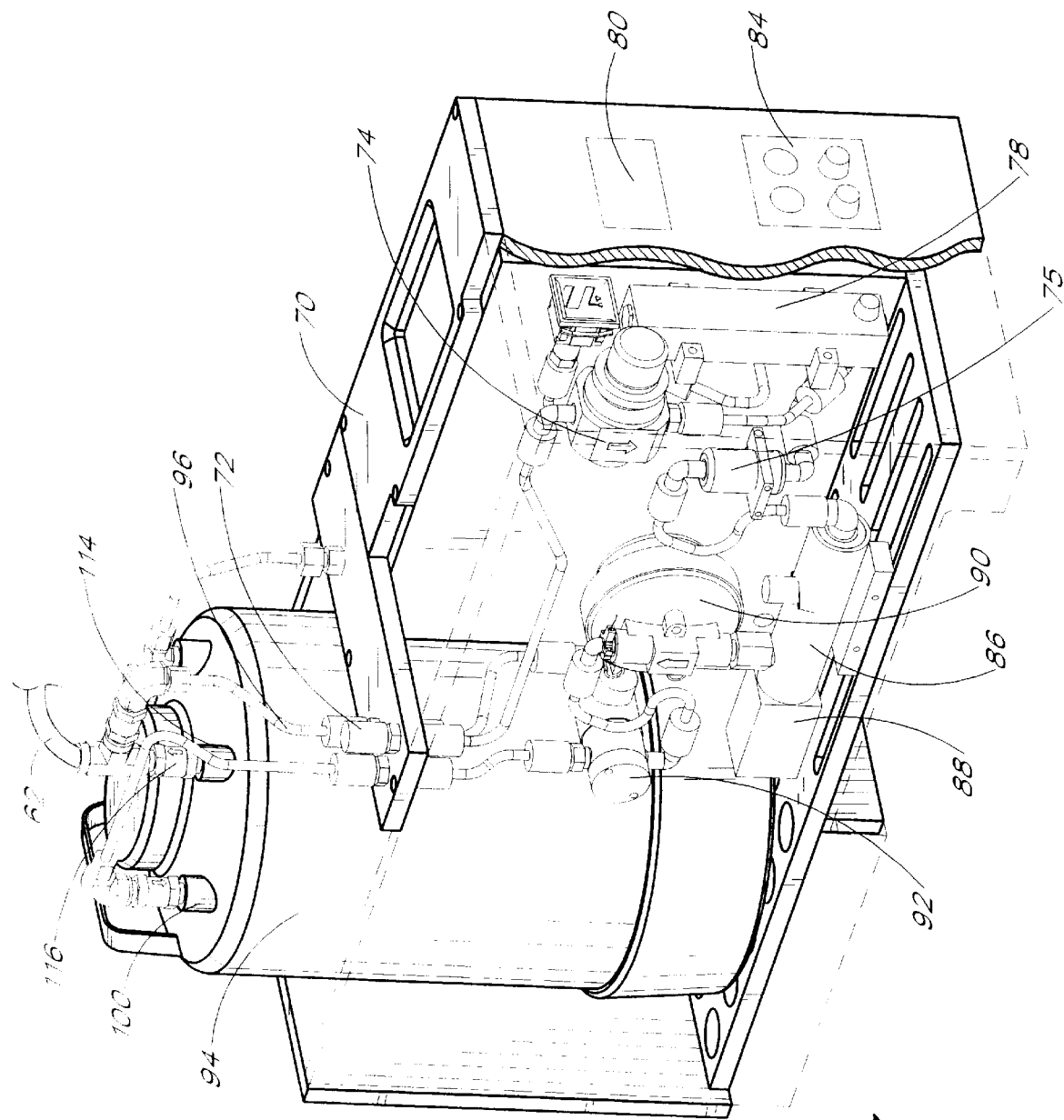
FIG. 3 is a perspective view of the bubbler.
Figure 4:
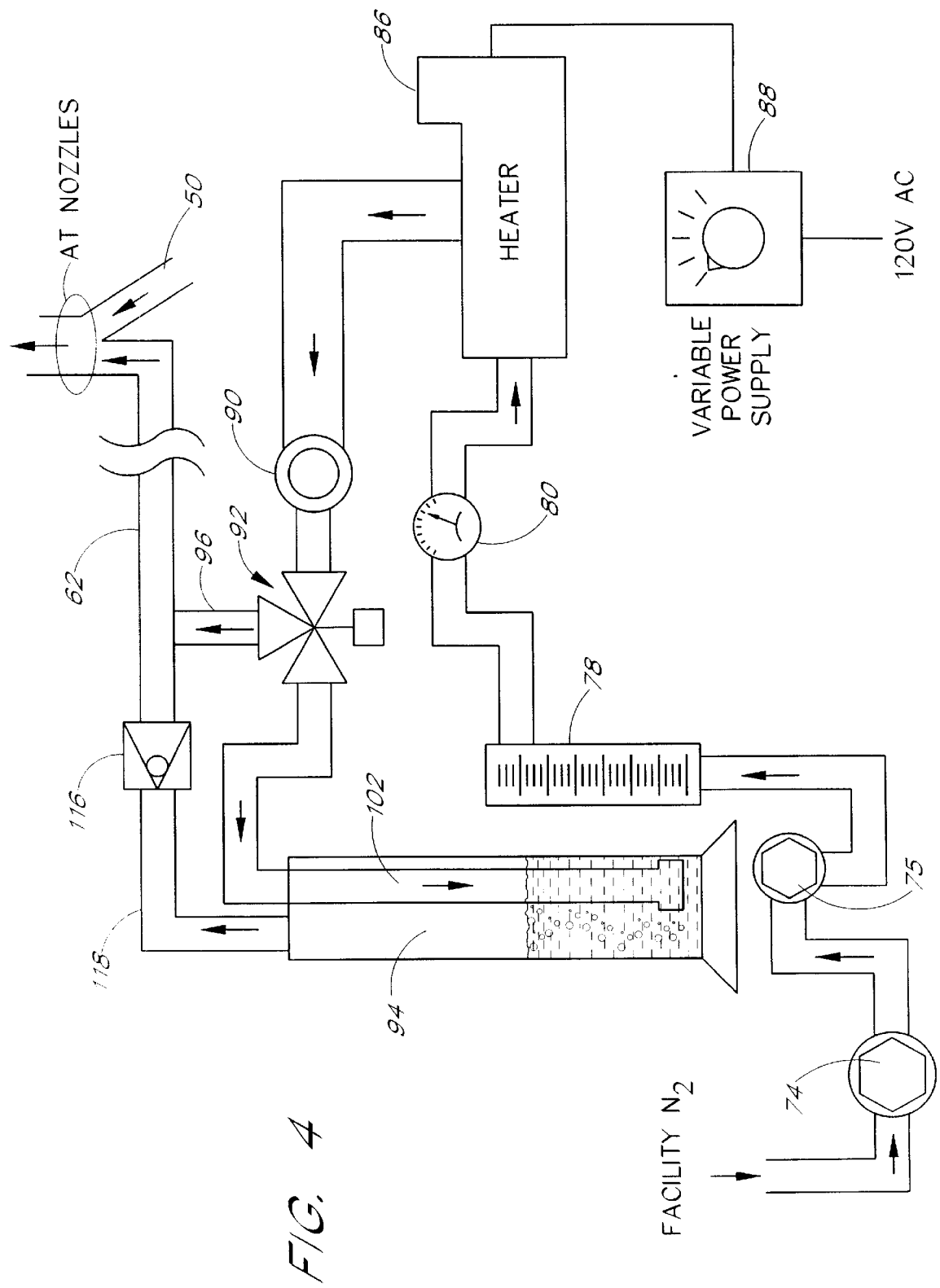
FIG. 4 is a flow diagram of gas within the bubbler.

Referring to FIGS. 3 and 4, the bubbler 4 provides heated nitrogen gas (hereinafter "gas") or heated gas containing IPA vapor to the spin unit 2. An outer shell 70 covers the internal components of the bubbler 4.

Nitrogen gas, which is generally plumbed directly into modern clean rooms, enters the bubbler 4 through an intake connector 72 on the outside of the bubbler. Alternatively, a gas besides nitrogen, such as argon, or ultra-pure dry air, would prove adequate. However, nitrogen is most preferable because it is inert, inexpensive in a contaminant free state and usually plumbed into clean rooms.

A first pressure regulator 74, at the facility, controls the pressure of the gas entering the bubbler 4. Thereafter, the gas enters a second pressure regulator 75 and pressure gauge 78 which controls the gas pressure for the bubbler 4 and displays the same on a corresponding flow rate monitor 80. An electronic bubbler controller 84, described in greater detail below, controls the gas pressure.

A suitable gas heating system 86 heats the gas flowing in the bubbler 4. A variable voltage power supply 88 selectably controls the temperature of the gas. The heater 86 advantageously warms the gas to hasten wafer drying within the previously described spin unit 2 and further increases the absorption of IPA into the gas.

After heating, a filter 90 further purifies the gas, after which a three-way valve 92 selectably communicates the gas directly to an IPA reservoir 94 or into a bubbler bypass line 96 and into a bubbler output line 62 to the spin unit 2. The reservoir 94, as shown in greater detail in FIGS. 3 and 5, comprises a cylindrical tank having a generally flat base with a plurality of gas ports at the top of the tank. The reservoir 94 contains liquid IPA although other liquid solvents which decrease the surface tension of water are acceptable. A gas intake port 100 links output of the three-way valve 92 to a reservoir flow tube 102 extending to near the lower end of the reservoir 94. At the bottom end of the reservoir flow tube 102 is a diffuser 104, FIG. 6, that aerates or disperses the gas into small bubbles. Aeration of the gas increases the surface area exposed to the IPA, thereby increasing IPA absorption.

Figure 5:
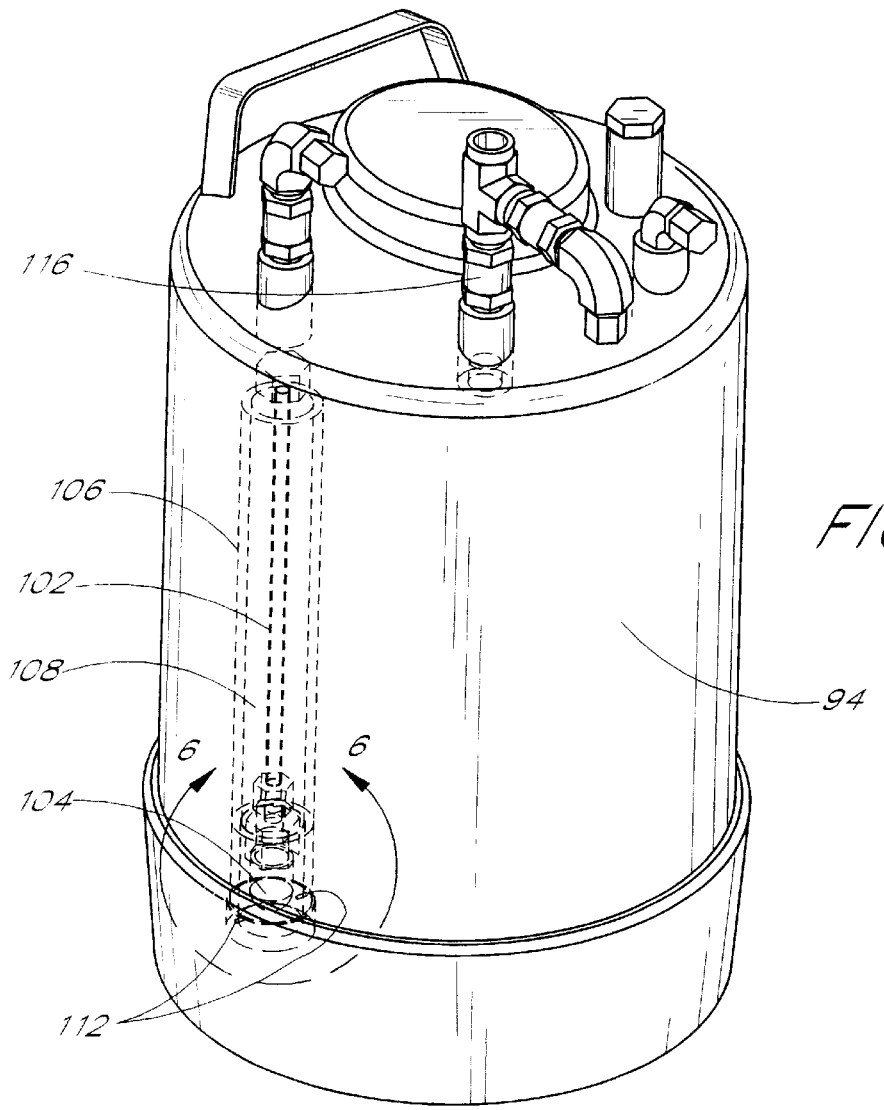
FIG. 5 is a cross-sectional perspective view of the reservoir of the bubbler, as shown in FIG. 3.
Figure 6:
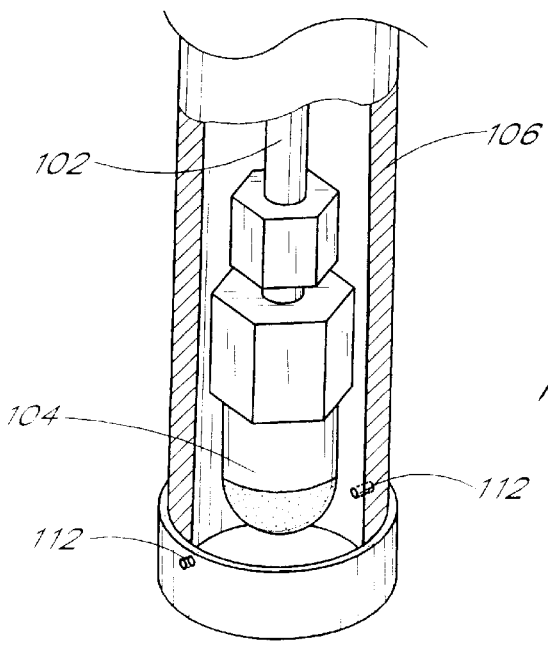
FIG. 6 is a cross-sectional perspective view of the bottom of the insulator tube, as indicated by line 6—6 in FIG. 5.

Surrounding the reservoir flow tube 102 is an insulator tube 106 seen in FIGS. 5 and 6. The insulator tube 106 is spaced from the reservoir flow tube 102 to create an annular space 106 open to the remainder of the reservoir through one or more small resupply holes or tubes 112 at the base of the insulator tube. The upper end of the insulator tube 106 is in gaseous communication with the gas filled upper portion of the reservoir 94. The insulator tube 106 confines the upward gravitation of gas bubbles to the inner volume of the insulator tube. Accordingly, the gas is thereby exposed to a limited volume of liquid which warms the liquid found therein. Absent the insulator tube 106, the warm gas would have to heat a greater volume of the liquid within the reservoir 94 to maintain a desired temperature of the gas bubbling through the reservoir. This facilitates the use of a large reservoir while minimizing the heat required to obtain the desired IPA flow to the spin unit. Alternatively, the liquid could be heated while gas at room temperature bubbles therethrough, however, heating IPA is undesirable because of risk of explosion or fire.

A gas outlet port 114 directs the gas flow, which now contains IPA vapor, to an outlet pipe 118 through to a check valve 116 to the gas line 62. The check valve 116 is a one way flow regulator which prevents contaminants from back flowing into the reservoir 94 and further prevents a pressure increase in the outlet pipe 118 to cause the liquid in the reservoir 94 to back flow.

The bubbler 4 links electronically by electrical cables 58 to the spin unit 2 to coordinate the introduction of gas flow and vapor during the appropriate time in the drying process. The bubbler output line 62, communicates gas between the spin unit 2 and the bubbler 4.

The bubbler controller 84 electronically controls the bubbler 4, including the valve 92, pressure regulators 74, 26 and the heater 86. The controller's electronics are of diverse nature and are commonly available in the industry, and accordingly are not shown or described in greater detail.

In another embodiment, a number of different devices could replace the bubbler unit 4. A number of different apparatus and methods exist, beside a bubbler output line 62, for providing the gas to the substrates.

Alternatively, both units 2, 4 can combine into a single unit, however, for ease of explanation, this document discusses both units separately. In addition, the bubbler 4 may "add on" to an existing spin unit 2 as a retrofit device thereby configured as shown in FIG. 1.

Preferably, the present invention operates using IPA liquid in the reservoir 94. IPA vapor, which has a flash point of approximately 80 degrees Celsius (C), is flammable. Bubbling heated gas through IPA liquid to create IPA vapor is much preferred over boiling IPA liquid to create vapor. Further, and as described in greater detail below, the percentage of IPA vapor to nitrogen gas is sufficiently low to essentially eliminate the risk of explosion or fire.

In operation, a carrier with substitutes therein enters the housing 16 through an open door 12 and placed in the rotatable frame 28. The door 12 closes, creating an airtight seal. Actuating control electronics 56 energizes the motor 20 to rotate the carrier and the substrates. Throughout the drying process, heated nitrogen gas is injected into the spin unit housing 16. Alternatively, other inert gases may substitute for nitrogen. However, nitrogen is most preferable because it is inexpensive and is often present in an ultra-pure and pressurized state in clean rooms.

Gas flow into the housing 16 of the spin unit 2 is a combination of gas flow from two gas sources. Gas flow into the main gas line 50 combines with gas flow from the bubbler's bubbler output line 62 which comprises heated nitrogen gas, and at appropriate times (defined below) IPA vapor.

The following charts illustrate the sequence, timing and recipe of an example of the present invention when drying philic and phobic wafers, respectively. The process for philic wafers, as contrasted by Table A and Table B, differs from the process for phobic wafers. Philic wafers are wafers to which water adheres and are harder to try. Phobic wafers are wafers that repel or easily displace water from their surface. Phobic wafers are substantially free of water when they enter the housing 16.

between 300 and 1400 revolutions per minute (RPM) or more preferably between 600 RPM and 1050 RPM or most preferably at 900 RPM. Injected into the housing 16 is a mixture of nitrogen gas from the main gas line 50 at 5.5 cfm at 59 psi (12.5 scfm) and heated nitrogen gas from the bubbler 4, containing IPA vapor, at 26 psi having a flow rate of 0.83 (1.4 scfm). During the 60 seconds of Recipe Step 0,

TABLE A

Process for Philic Wafers

| Steps | Main Gas Line 50 | Bubbler output line 62 | Gas Temp. | RPM | N2 Usage | Valve Position |
|---|---|---|---|---|---|---|
| Standby | N2 @ wall; 1.75 cfm @ 66 psi, (4.2 scfm) | 1.5 cfm @ 13 psi, (2.1 scfm) | 20–45° C. | 0 | 6.3 scfm | Bypass |
| Closing Cover, 12 sec. | N2 @ wall; 1.75 cfm @ 66 psi (4.2 scfm) | 1.5 cfm @ 13 psi, (2.1 scfm) | 20–45° C. | 0 | 1.26 scf | Bypass |
| Recipe Step 0, 60 sec. | N2 @ wall; 5.5 cfm @ 59 psi (12.5 scfm) | 0.83 cfm @ 26 psi, (1.4 scfm) | 20–45° C. | 900 RPM | 13.9 scf | Bubbler |
| Recipe Step 1, 10 sec. | N2 @ wall; 5.5 cfm @ 59 psi (12.5 scfm) | 0.83 cfm @ 26 psi, (1.4 scfm) | 20–45° C. | 750 RPM | 2.32 scf | Bubbler |
| Spin Slow Down, 22 sec. | N2 @ wall; 5.5 cfm @ 59 psi (12.5 scfm) | 1.1 cfm @ 22 psi, (1.75 scfm) | 20–45° C. | 0 | 5.23 scf | Bypass |
| Opening Cover, 9 sec. | N2 @ wall; 1.75 cfm @ 66 psi (4.2 scfm) | 1.5 cfm @ 13 psi, (2.1 scfm) | 20–45° C. | 0 | 0.95 scf | Bypass |
| Total Time, 113 sec. | | | | | | |

Notes: N2 - nitrogen gas; cfm - cubic feet per minute; scfm - standarized cubic feet per minute; scf - standardized cubic feet The process for philic wafers initially places the bubbler unit in a standby mode. In standby mode, the nitrogen flow in the main gas line 50 flows at 1.75 cfm at 66 pounds per square inch (psi) (4.2 scfm) and combines with the flow in the bubbler output line 62 before flowing into the housing 16 through the inlet 44. The heated gas in the bubbler output line 62 flows at about 13 psi and has a flow rate of 1.5 cubic feet per minute (cfm) (2.1 scfm). The heater warms the gas to approximately 20–45 degrees Celsius. The three-way valve 116 bypasses the IPA reservoir 94. When in standby mode, nitrogen usage is approximately 6.3 standard cubic feet per minute (scfm).

Next, the wafers enter the housing 16 and the door 12 closes. This step, entitled "closing cover", requires approximately 12 seconds. Nitrogen continues to flow through the main gas line 50 at 1.75 cfm at 66 psi (4.2 scfm). Likewise, heated gas, absent IPA vapor, flows through the bubbler output line 62 at 13 psi with a flow rate of 1.5 cfm (2.1 scfm) to combine with the flow in the main gas line 50 before entering the housing 16. This phase of the process uses 1.26 scf of nitrogen gas.

The third step, "Recipe Step 0", initiates the rotational movement of the wafers. For 60 seconds, the wafers spin at the nitrogen absorbs approximately 1.5–7.0 ml of IPA liquid and the system uses about 13.9 scf of nitrogen gas. The temperature of the gas exiting the bubbler 4 maintains a temperature of between 10 to 70 degrees C. or more preferably between 15 to 55 degrees C. or most preferably between 20 to 45 degrees C. at the point the gas enters the reservoir 94.

After the 60 seconds of Recipe Step 0 elapses, the spin unit 2 enters Recipe Step 1. During Recipe Step 1 the gas flow through the spin unit 2 remains constant while the rotational speed of the wafers decreases to between 200 and 1300 RPM or more preferably to between 400 and 900 RPM or most preferably to 750 RPM for 10 seconds. During this phase, the system uses 2.32 scf of nitrogen.

Subsequently, the spin unit 2 enters the "spin slow down" phase. This phase takes 22 seconds to complete, during which the flow in the main gas line 50 remains constant at 5.5 cfm at 59 psi (12.5 scfm) and combines with flow in the bubbler output line 62 at 22 psi flowing at 0.83 cfm (1.4 scfm) with the reservoir 94 bypassed. During this phase the system uses 5.23 scf of nitrogen.

The door 12 is then opened and the substrates removed from the housing 16, which takes approximately 9 seconds.

When the door 12 opens, flow through the gas inlets 44 into the housing 16 continues. The flow in the main gas line 50, at 1.75 cfm at 66 psi (4.2 scfm), combines with the flow in the bubbler output line 62. The flow in the bubbler output line 62 is at 13 psi and has a flow rate of 1.5 cfm (2.1 scfm). The flow through the bubbler output line 62 does not contain IPA vapor, the reservoir 94 being bypassed. The system 2, 4 uses about 0.95 scf of nitrogen gas during this phase of operation. The total time for the system to complete the drying process, from substrate loading, drying, and unloading is approximately 113 seconds.

TABLE B

Process for Phobic Wafers

| Steps | Main Gas Line 50 | Bubbler output line 62 | Gas Temp. | RPM | N2 Usage | Valve Position |
|---|---|---|---|---|---|---|
| Standby | N2 @ wall; 1.75 cfm @ 66 psi, (4.2 scfm) | 1.5 cfm @ 13 psi, (2.1 scfm) | 20–45° C. | 0 | 6.3 scfm | Bypass |
| Closing Cover, 12 sec. | N2 @ wall; 1.75 cfm @ 66 psi (4.2 scfm) | 1.5 cfm @ 13 psi, (2.1 scfm) | 20–45° C. | 0 | 1.26 scf | Bypass |
| Recipe Step 0, 130 sec. | N2 @ wall; 17.5 cfm @ 66 psi (4.2 scfm) | 1.17 cfm @ 13 psi, (1.8 scfm) | 20–45° C. | 750 RPM | 8 scf | Bubbler |
| Spin Slow Down, 22 sec. | N2 @ wall; 1.75 cfm @ 66 psi (4.2 scfm) | 1.5 cfm @ 13 psi, (2.1 scfm) | 20–45° C. | 0 | 2.31 scf | Bypass |
| Opening Cover, 9 sec. | N2 @ wall; 1.75 cfm @ 66 psi (4.2 scfm) | 1.5 cfm @ 13 psi, (2.1 scfm) | 20–45° C. | 0 | 0.95 scf | Bypass |
| Total Time, 223 sec. | | | | | | |

Notes: N2 - nitrogen gas; cfm - cubic feet per minute; scfm - standarized cubic feet per minute; scf - standardized cubic feet The process for phobic wafers, as shown in Table B above, also begins with the system in standby mode. During standby, the spin unit 2 awaits loading. Nitrogen flows into the housing 16 from the combined flow of the main gas line 50 at 1.75 cfm at 66 psi (4.2 scfm) and the bubbler 4, with the reservoir 94 bypassed, at 13 psi and 1.5 cfm (2.1 scfm). As with the philic wafer process, the gas exiting the bubbler 4 is at 20–45 degrees C.

Next, the wafers enter the housing 16 and the door 12 closes. This phase takes 12 seconds and gas flow into the housing 16 remains constant in relation to standby mode. During this phase the system uses 1.26 scf of nitrogen gas and the three-way valve 116 bypasses the reservoir 94.

Recipe Step 0 spins the wafers at between 200 RPM and 1300 RPM or more preferably between 400 RPM and 900 RPM or most preferably at 750 RPM for 180 seconds. During this time, gas from the main gas line 50 at 1.75 cfm at 66 psi (4.2 scfm) combines with heated gas and IPA vapor in the bubbler output line 62 at 13 psi and 1.17 cfm (1.8 scfm) before flowing into the housing 16 through the nozzles 44. Total nitrogen usage during this phase is 18 scf. Alternatively, the nitrogen flowing into the housing 16 though the main gas line 50 may be eliminated to further reduce the possibility of introducing particulate matter onto the wafers.

Next the system goes into "spin slow down" phase. This phase takes 22 seconds during which the wafers to stop spinning and the combined gas flow into the housing 16 comprises gas from the main gas line 50 at 1.75 cfm at 66 psi (4.2 scfm) and heated gas absent IPA vapor from the bubbler 4 through the bubbler output line 62 at 13 psi and 1.5 cfm (2.1 scfm). Total nitrogen usage during this phase is 2.31 scf.

Finally the door 12 opens, which takes approximately 9 seconds, and the wafers exit the housing 16. When the door 12 opens, flow into the housing 16 remains constant from the last step. The flow in the main gas line 50 stays the same, combines with the flow in the bubbler output line 62. The flow in the bubbler output line 62 is at 13 psi and has a flow rate of 1.5 cfm (2.1 scfm). The flow through the bubbler output line 62 does not contain IPA vapor. The system uses about 0.95 scf of nitrogen during this phase of operation. The total time for the system to complete the drying process for phobic wafers, from wafer loading, drying, and unloading is approximately 223 seconds.

Processes other then the processes described are acceptable but less desirable because additional gas flow increases costs and does not generally affect the dry rate, water adhesion or dry cycle time for the configuration of this preferred embodiment. Further, altering the processes may introduce additional particles onto the wafers. Flow rates lower than the flow rates as defined herein slow the drying process and undesirably decrease IPA vapor in the housing 16.

Advantageously, this embodiment uses an extremely low amount of IPA liquid or vapor in relation to the nitrogen gas. This aspect significantly decreases the risk of explosion and decreases the amount of regulated IPA used. For the flow rate described herein for a cassette of 25 wafers the gas only absorbs approximately 1.5 ml/min of IPA when the nitrogen temperature is 20 degrees C. and approximately 7.0 ml/min of IPA liquid when the nitrogen temperature is 45 degrees C. Using basic mathematical calculations and conversions, the ratio of nitrogen to IPA vapor at 20 degrees C. is 28,302 cc/min nitrogen to 470 cc/min IPA vapor or approximately 60:1 nitrogen to IPA vapor. At 45 degrees C., 7.0 ml/min or IPA is evaporated resulting in a ratio of 56,604 cc/min nitrogen to 2380 cc/min IPA vapor or 24:1. The amount of IPA vapor in the heated nitrogen can be controlled by the temperature and flow rate of the gas. Varying the ratio of IPA to nitrogen gas does not depart from the inventive aspects of the present invention.

The drying vapor is of course further diluted when it mixes with the nitrogen from the main gas line, thus using the gas flows indicated in the two tables above indicate a dilution ratio of 214 to 536 parts of nitrogen to one part drying vapor for the philic wafers of Table A, and a ratio of 86 to 536 parts of nitrogen to one part of drying vapor for the philic wafers of Table B.

Advantageously, low IPA concentrations decrease the risk of fire or explosion. Furthermore, the low concentrations of vaporous IPA do not damage the fragile surface of the substrate. Likewise, low concentrations of IPA does not overload the scrubber units designed to limit the amount of IPA released to the air. Certain centrifugal dryers utilize an amount of the nitrogen gas flowing in the main gas line 50 to maintain a gas seal between the housing 16 and the frame 38. The gas seal uses some of the nitrogen gas thereby changing the ratio of nitrogen to IPA vapor. However, the amount of gas diverted to the seal is not substantial and such deviations in the ratio of carrier gas to solvent vapor does not depart from the scope of the invention described and claimed herein.

The IPA absorption rate remains constant at reservoir levels greater then ¼ full. Therefore, the gas flowing through the reservoir 94 generally saturates with IPA vapor at the operating temperature and flow rate. This advantageously eliminates reservoir level monitors and absorption monitors to control and maintain IPA saturation. Preferably, the heater 86 warms the gas exiting the bubbler 4 to 20–45 degrees C. However, the carrier and the wafers enter the housing 16 at generally room temperature. The elevated temperature of the gas hastens wafer drying and increases the amount of IPA absorbed into the gas bubbling through the reservoir 94. Those of skill in the art realize that the temperature of the gas may vary without departing from the inventive scope of the claimed invention.

The rapid rotation of the frame 28, carrier and wafers therein aids integration and distribution of the IPA vapor within the housing 16. Furthermore, the introduction of IPA vapor into the housing 16 during the spin dry process overcomes a drawback of prior spin drying methods by decreasing static electricity buildup on the carrier and wafers. Static electricity, i.e., an electrical charge, on the carrier or wafers undesirably attracts particulate contaminants and may instigate fire or explosion.

Absent from the timing diagram of FIGS. 7A and 7B is the injection of water through the rinse nozzles 52. When drying philic wafers, shown in FIG. 7A, the rinse nozzles 52 may spray water into the housing 16 to further clean the wafers prior to the initiation of the spin dry process. Accordingly, the addition of water onto the wafers and into the housing 16 may increase the length of the drying cycle.

As seen in FIG. 7B, the present invention takes longer to dry a phobic wafer then a philic wafer because when drying phobic wafers less gas flows through the housing 16. Decreasing the gas flow through the housing 16 advantageously reduces particulate contamination on phobic wafers.

When the door 12 opens and the wafers are removed, gas continues to flow through the air inlets 44 and into the housing 16 to prevent the influx of contamination therein. The wafers, being dry, clean and with little or no water marks, move to the next processing step.

Another carrier containing wafers may subsequently enter the housing 16 for drying. Alternatively, the spin unit 2 may perform a rinse cycle to clean the frame 28 and housing 16. In rinse mode the rinse nozzles 52 spray water into the housing 16 to flush unwanted chemicals and particulate contaminants. However, hydration of the housing's inner surface 42 immediately prior to insertion of a carrier containing wafers increases the time required to completely dry the next batch of wafers.

It will be understood that the above described apparatus and method illustrate a preferred embodiment. Other arrangements may be made without departing from the spirit or scope of the general inventive concept as defined by the appended claims and their equivalents. For example, vapor generation, other than bubblers, may be employed. Also, substrates may be mounted in a dryer without the use of a separate substrate carrier.

What is claimed is:

1. An apparatus for drying semiconductor wafers comprising:

a support for receiving a cassette constructed to receive a plurality of wafers to be dried;

a motor for rotating the support in a manner to remove moisture from the wafers by centrifugal force;

a housing enclosing the support;

one or more nozzles within the housing for introducing drying gas into the housing;

a source of drying vapor connected to be injected into the housing, said source comprises a supply of the liquid form of said vapor and a supply of carrier gas connected to the liquid supply to flow in communication with the liquid to produce the drying vapor;

a valve connected to direct the carrier gas to the liquid source or alternatively to direct the carrier gas to bypass the liquid source and flow directly to the housing; and a controller to control the introduction of said gas and said vapor, to control said valve, and to control the timing of the introduction of the gas and the vapor and the quantities of gas in relation to the vapor during a drying cycle.

2. The apparatus of claim 1, wherein the drying gas comprises nitrogen gas in isopropyl alcohol vapor.

3. The apparatus of claim 1, wherein said drying gas comprises a mixture of nitrogen to vapor having a ratio of more than 60 parts nitrogen gas to one part vapor.

4. A method of drying semiconductor wafers and the like:

placing a cassette into a spin dryer, with the cassette containing one or more wafers;

closing the cover of the dryer;

flowing drying gas from a main gas line into the dryer while loading the cassette into the dryer and while closing the cover;

providing a bubbler containing a liquid which is miscible with water when vaporized;

providing a conduit for bubbling a carrier gas through the bubbler and into the dryer to carry vapor from said liquid to facilitate drying of the wafers;

providing a bypass valve in the conduit leading to the bubbler for selectively flowing the carrier gas through the bubbler or more directly into the dryer;

positioning the bypass valve so that the carrier gas bypasses the bubbler while the cassette is being loaded into the dryer and while the cover is being closed;

operating the dryer to spin the cassette at a rate to facilitate the removal of moisture on the wafers by centrifugal action;

moving the bypass valve into position where the carrier gas flows through the bubbler and carries drying vapor into the dryer; and returning the bypass valve to the bypass position while stopping the spinning of the cassette and opening the cover to remove the cassette.

5. The method of claim 4, wherein the gas from the main gas line and from the carrier gas line flow through the dryer while the cassette is being loaded and unloaded from the dryer and while the dryer cover is being closed and opened is about 6 standard cubic feet per unit.

6. The method of claim 4, wherein the carrier gas flow when the bypass valve is positioned to direct the carrier gas flow to flow into the bubbler is at a rate of about 1½ standardized cubic feet per unit with the drying liquid having a temperature in the range between 20° and 45° C., and the main gas flow through the dryer from the main gas line is about 12 standardized cubic feet per unit.

7. The method of claim 4, wherein the cassette is first rotated at a rate of about 900 rpm for about 1 minute, and is then rotated at a speed of about 750 rpm per minute for about 10 seconds.

8. The method of claim 4, wherein during said rotating step, drying gas through the main gas line is flowing at a rate of about 4 standard cubic feet per minute and the nitrogen flowing through the bubbler and being combined with the drying vapor flows at a rate of about 2 standard cubic feet per minute at a rate of about 750 rpm per minute for about 2 minutes.

9. The method of claim 4, wherein the quantity of drying liquid from the bubbler utilized during a drying operation is in the range of 1½ to 7 milliliters per minute.

10. The method of claim 4, wherein the amount of gas flowing through the dryer while the drying vapor is flowing through the dryer is more than 24 times that of the drying vapor.

11. The method of claim 4, wherein the quantity of drying vapor utilized during the drying operation in relation to the quantity of nitrogen utilized during the drying operation is in the range of 24 to 500 times as much nitrogen gas as drying vapor.

12. A method of drying wafers comprising:

placing into a centrifugal dryer a carrier containing one or more wafers;

bubbling a carrier gas through a reservoir containing a solvent liquid, which when in vapor form reduces the surface tension of moisture on a wafer, to form a solvent vapor/carrier gas mixture;

combining said mixture with a separate flow of carrier gas before contacting said wafers;

introducing said mixture into said dryer to contact said wafers; and after the wafers are substantially dry, interrupting the flow of carrier gas through said liquid and conducting direct to the dryer the carrier gas that had been flowing through the liquid.

* * * * *